United States Patent
Shveykin et al.

(10) Patent No.: US 8,401,046 B2
(45) Date of Patent: Mar. 19, 2013

(54) MULTIBEAM COHERENT LASER DIODE SOURCE (EMBODIMENTS)

(75) Inventors: Vasiliy Ivanovich Shveykin, Moscow (RU); Viktor Archilovich Gelovani, Moscow (RU); Aleksey Nikolaevich Sonk, Moscow (RU)

(73) Assignee: General Nano Optics Limited, Nicosia (CY)

( * ) Notice: Subject to any disclaimer, the term of this patent is extended or adjusted under 35 U.S.C. 154(b) by 0 days.

(21) Appl. No.: 13/384,531

(22) PCT Filed: Jul. 7, 2010

(86) PCT No.: PCT/RU2010/000377
§ 371 (c)(1),
(2), (4) Date: Jan. 17, 2012

(87) PCT Pub. No.: WO2011/008127
PCT Pub. Date: Jan. 20, 2011

(65) Prior Publication Data
US 2012/0113998 A1    May 10, 2012

(30) Foreign Application Priority Data
Jul. 17, 2009   (RU) ............................... 2009127486

(51) Int. Cl.
*H01S 3/13* (2006.01)
(52) U.S. Cl. ........................................ 372/31; 372/50.12
(58) Field of Classification Search ............ 372/69, 372/75, 45.01
See application file for complete search history.

(56) References Cited

U.S. PATENT DOCUMENTS 4,063,189 A * 12/1977 Scifres et al. .............. 372/45.01
2004/0136424 A1* 7/2004 Shveykin ..................... 372/44

FOREIGN PATENT DOCUMENTS

| EP | 1906499 A1 | 4/2008 |
| JP | 2003078209 A | 3/2003 |
| RU | 2134007 C1 | 7/1999 |
| RU | 2197048 C1 | 1/2003 |
| RU | 2278455 C1 | 6/2006 |

OTHER PUBLICATIONS

International Search Report for International Application No. PCT/RU2010/000377 dated Nov. 18, 2010.

* cited by examiner

*Primary Examiner* — Yuanda Zhang
*Assistant Examiner* — Tuan Nguyen
(74) *Attorney, Agent, or Firm* — TransPacific Law Group; Pavel I. Pogodin, Esq.

(57) ABSTRACT

A multibeam coherent laser diode source comprises a master laser, a linear amplifier and two perpendicular amplifiers. The master laser and amplifiers are in the form of a single heterostructure containing an active layer, two limiting layers and a radiation influx area with an influx layer. The heterostructure is characterized by the ratio of the refractive index of the heterostructure to the refractive index of influx layer. This ratio is determined from a range extending from one plus delta to one minus gamma, where delta and gamma are defined by a number much less than one and gamma is greater than delta. The linear amplifier is positioned so that optical axis of radiation propagation from master laser coincides with the axis of the linear amplifier. Each perpendicular amplifier has output edge and is positioned so that its optical axis is situated at right angle to the axis of linear amplifier.

20 Claims, 7 Drawing Sheets

MULTIBEAM COHERENT LASER DIODE SOURCE (EMBODIMENTS)

FIELD OF THE INVENTION

The invention relates to key components of optoelectronic engineering—to compact, high-power, high-efficiency sources of laser coherent emission in a wide wavelength range, namely, to a diode source of multibeam coherent emission with horizontal emission output and to a diode source of multibeam coherent emission with vertical emission output, said sources being made as a two-stage combination of a master diode laser with diode optical amplifiers.

DESCRIPTION OF THE RELATED ART

Diode lasers of increased output power and improved laser beam quality are known from the following inventions: [U.S. Pat. No. 4,063,189, Xerox Corp., (US), 1977, H01S 3/19, 331/94.5 H], [RU Patent 2197048, V. I. Shveikin, V. A. Gelovani, 18 Feb. 2002, H01S 5/32].

From the standpoint of the technical essence and the technical result being obtained, an exemplary prototype injection (hereinafter diode) laser is proposed in [RU Patent 2278455, V. I. Shveikin, 17 Nov. 2004, H01S 5/32]. Said diode laser includes a heterostructure based on semiconductor compounds, optical facets, reflectors, ohmic contacts, an optical resonator. The heterostructure is characterized by the ratio of the effective refractive index $n_{eff}$ of the heterostructure to the refractive index $n_{IN}$ of the leak-in layer. The ratio of $n_{eff}$ to $n_{IN}$ (hereinafter referred to as $n_{eff}/n_{IN}$) is determined from the range from one plus delta to one minus delta, where delta is determined by a number much less than one. The heterostructure contains at least one active layer, at least two reflective layers (hereinafter referred to as the cladding layers), at least one on each side of the active layer, said cladding layers are formed at least of one sublayer and have refractive indices less than the effective refractive index $n_{eff}$ of the heterostructure. The heterostructure contains also at least one emission leak-in region transparent for emission. The leak-in region is located between the active layer and a corresponding cladding layer, at least on one side of the active layer. The leak-in region includes a laser emission leak-in layer having a refractive index $n_{IN}$ and consisting at least of one sublayer; at least one confining layer consisting at least of one sublayer; a main adjusting layer consisting at least of one sublayer, having at least for one of its sublayers a refractive index no less than the refractive index $n_{IN}$ of the leak-in layer, and adjacent with one its surface to the active layer. On the opposite side of the main adjusting layer to another its surface a confining layer of the leak-in region is adjacent, said confining layer has a refractive index less than the refractive index of the main adjusting layer. The reflection coefficients of the optical resonator reflectors as well as the compositions and thicknesses of the heterostructure layers are chosen such that for the operating diode laser the resulting amplification of emission in the active layer is sufficient to maintain a lasing threshold throughout the range of operating currents. We have called such a construction of a diode laser a diode laser based on a heterostructure with a leak-in region that is characterized by a specific ratio $n_{eff}$ to $n_{IN}$ in the field of lasing threshold currents. For the given heterostructure the ratio $n_{eff}$ to $n_{IN}$ in the field of lasing threshold currents is determined from the range of values from one plus gamma to one minus gamma, where the value of gamma is determined by a number less than delta.

The main advantages of the prototype diode laser are the augmentation of laser output power, the increase of the size of the emitting area in the vertical plane with corresponding reduction of angular divergence of emission. At the same time the prototype diode laser limits further increase of output power with simultaneous high quality of its laser emission, namely, it is not possible to realize high-power single-frequency diode sources of multibeam coherent emission (with a perfection factor $M^2$ near one) as two-stage integrated combinations of a master diode laser and diode optical amplifiers with output of amplified laser emission both in the horizontal and in the vertical plane.

SUMMARY OF THE INVENTION

The technical result of the proposed diode source of multibeam, coherent amplified laser emission with various required emission outputs in a wide wavelength range is the increase of many times (one-three and more orders of magnitude) of output power of its amplified laser emission for stable single-frequency and single-mode laser types of oscillation, the increase of efficiency, reliability, life time and modulation speed with significant simplification of technology for source manufacturing and cut in the production costs.

The technical result of the proposed diode source of multibeam, coherent amplified laser emission with various required emission outputs in a wide wavelength range is the increase of many times (one-three and more orders of magnitude) of output power of its amplified laser emission for stable single-frequency and single-mode laser types of oscillation, the increase of efficiency, reliability, life time and modulation speed with significant simplification of technology for source manufacturing and cut in the production costs.

One aspect of the present invention is a diode source of multibeam coherent laser emission (hereinafter referred to as the DSMCLE) containing at least one, at least single-mode, single-frequency master diode laser hereinafter referred to as the master laser, at least one diode optical amplifier hereinafter referred to as the linear amplifier integrally and optically connected with said master laser, at least two diode optical amplifiers hereinafter referred to as the perpendicular amplifiers integrally and optically connected with the linear amplifier. Said master laser and said linear amplifier and said perpendicular amplifiers are formed in a common heterostructure based on semiconductor compounds. Said heterostructure contains at least one active layer, at least two cladding layers, and an emission leak-in region transparent for emission. Said leak-in region is placed between the active layer and a corresponding cladding layer at least on one side of the active layer, said leak-in region contains at least a leak-in layer. Said heterostructure is characterized by the ratio of the effective refractive index $n_{eff}$ of the heterostructure to the refractive index $n_{IN}$ of the leak-in layer, namely, the ratio $n_{eff}$ to $n_{IN}$ is in the range from one to one minus gamma, where gamma is determined by a number much less than one. Said master laser includes an active stripe lasing region with connected metallization layers, an emission confinement region with a connected insulating layer, said confinement region is located on each lateral side of the active lasing region of the master laser, as well as ohmic contacts, optical facets, reflectors, an optical resonator. On both optical facets the reflectors of the optical resonator have reflection coefficients near one, and they are located in the specified vicinity of location of the active layer of the heterostructure. Each linear amplifier including at least an active amplification region with connected metallization layers is located so that the optical axis of propagation of emission of the master laser coincides with the optical axis of the linear amplifier. Each perpendicular amplifier including at least an active amplification region with connected metallization layers and an optical output facet with an optical antireflection coating is located so that the optical axis of the perpendicular amplifier is located at a right angle (modulus) to the optical axis of the linear amplifier. In the vicinity of intersection of the optical axis of the linear amplifier with the optical axis of each perpendicular amplifier there is an integral element for flow of a specified portion of laser emission from the linear amplifier to the perpendicular amplifier that is arbitrarily called a rotary element. Said rotary element consists of at least one optical reflecting plane perpendicular to the plane of the heterostructure layers, crossing the active layer and part of the heterostructure leak-in region within the thickness of the leak-in layer from 20% to 80%, and making angles of inclination with the optical axes of the linear amplifier and of the perpendicular amplifier about 45° (modulus).

The essential distinction of the proposed new DSMCLE made on the basis of an original heterostructure consists in an efficient two-stage integrated combination of a master diode laser (hereinafter referred to as the master laser) connected with an integrated linear diode optical amplifier (hereinafter referred to as the linear amplifier), said linear amplifier being in turn connected with integrated perpendicular diode optical amplifiers (hereinafter referred to as the perpendicular amplifiers). The novelty of the proposed DSMCLE is that the integral connection of the master laser with said amplifiers is carried out without focusing optics. At the first stage the integral connection of the master laser and the linear amplifier is realized, in this case the directions of the optical axes of propagation of emissions of said master laser and linear amplifier coincide. At the second stage of integral connection of the linear amplifier and the perpendicular amplifier the directions of propagation of optical emissions of said amplifiers, that is, the directions of their optical axes are mutually perpendicular. The flow of laser emission from the linear amplifier to the perpendicular amplifiers is carried out with the use of original rotary elements placed at places of connection of the active regions of the perpendicular amplifiers to the lateral sides of the active regions of the linear amplifiers.

In the preferred embodiment the reflectors of the optical resonator of the master laser are on each optical facet from the heterostructure surface to a specified depth in the leak-in region. In this case the integral connection of the master laser (without focusing optics and practically without loss) with each of two linear amplifiers is carried out mainly through the deep-lying part of the leak-in layer of the heterostructure, bypassing the nontransmitting reflectors of the optical resonator of the master laser.

In the preferred embodiment the linear amplifier can be located on one end side of the optical resonator of the master laser, and on each end side of the optical resonator there can be one linear amplifier.

In the preferred embodiment the master laser provides lasing at one fundamental mode and, if necessary, provides single-frequency lasing. To achieve stable single-frequency lasing (as well as single-frequency tuning), said reflectors of the optical resonator of the master laser are made as distributed Bragg reflectors.

In the preferred embodiment in the lateral confinement region of the master laser there are at least one dividing-confinement subregion and at least one confinement subregion, at that the dividing-confinement subregion of a specified width is on both lateral sides of the active lasing region of the master laser from the heterostructure surface to a specified depth, not reaching the depth of location of the active layer, the confinement subregion is on both lateral sides of said dividing-confinement subregion from the heterostructure surface to a specified depth exceeding the depth of location of the active layer. The unusual lying of the confinement subregion (with crossing the active layer) provides the mode stability of laser emission at increased laser output powers.

In the preferred embodiment the active region of the linear amplifier can be made as a fully stripe region, or fully widening, or widening with a smooth transition to the stripe part. In the last embodiment the widening part of the active region of the linear amplifier is adjacent to the master laser, and the smooth transition of said widening part to the stripe active region is realized till the nearest location of the rotary element.

In the preferred embodiment to each lateral side of the active region of the linear amplifier a dividing-confinement subregion of a specified width is adjacent that is placed from the heterostructure surface to a specified depth, not reaching the depth of location of the active layer. When necessary, to each lateral side of the dividing-confinement subregion a confinement subregion is connected that is placed from the heterostructure surface to a specified depth exceeding the depth of location of the active layer.

In the preferred embodiment the optical reflective coating on the free optical facet of the linear amplifier has a reflection coefficient near one.

In the preferred embodiment the active region of the perpendicular amplifier can be made as a fully stripe region, or fully widening, or widening with a smooth transition to the stripe part. In the last embodiment the widening part of the active region of the perpendicular amplifier is adjacent to the linear amplifier, and the smooth transition of said widening part to the stripe active region is realized at a specified distance from the rotary element.

In the preferred embodiment to each lateral side of the active region of the perpendicular amplifier a dividing-confinement subregion of a specified width is adjacent that is placed from the heterostructure surface to a specified depth, not reaching the depth of location of the active layer. When necessary, to each lateral side of the dividing-confinement subregion a confinement subregion is connected that is placed from the heterostructure surface to a depth exceeding the depth of location of the active layer.

In the preferred embodiment the optical reflecting plane of at least one rotary element maximally removed from the reflector of the optical resonator of the master laser is made penetrating into the heterostructure, at least to the cladding layer on the side of the substrate.

In the preferred embodiment the optical antireflection coating at least on the optical facets of output of amplified emission of the perpendicular amplifier, has a reflection coefficient near zero.

In the preferred embodiment the optical reflecting plane of the rotary element has an angle of inclination of plus 45°, the optical reflecting plane of the rotary element next to said optical reflecting plane has an angle of inclination of minus 45°. This has allowed the realization of emission output in opposite directions.

In the preferred embodiment the common heterostructure contains at least two active layers electrically connected to one another by thin heavily doped layers of the p-type and the n-type with a tunnel transition between them.

The technical result is achieved not only in an asymmetric heterostructure, but also in a symmetric heterostructure, in which the thickness of the leak-in layer in the leak-in region on the side of the substrate is equal to the thickness of the leak-in layer in the leak-in region on the side of the external layer of the heterostructure.

In the preferred embodiment the master laser, the linear amplifiers, and the perpendicular amplifiers have independent ohmic contacts.

The essence of the unobvious DSMCLE proposed in the present invention consists in the proposed common heterostructure for a single-mode (and single-frequency) master laser, linear and perpendicular amplifiers with unusually large sizes of the near emission field in the plane perpendicular to the active layer of the heterostructure. The essence of the present invention consists also in the original and efficient two-stage process of integral connections: at the first stage the connection of a single-frequency, single-mode master laser with a linear amplifier, at the second stage the connection of linear amplifiers with perpendicular amplifiers. In this case the active regions of the perpendicular amplifiers are placed at a right angle to the active amplification regions of the linear amplifiers. The flow of a specified portion of laser emission from the linear amplifiers to the perpendicular amplifiers is realized by introduced original rotary elements placed at places of intersection of the active regions of the linear amplifiers with the perpendicular amplifiers. In this case the "horizontal" output of amplified laser emission in the directions parallel to the heterostructure plane is realized.

The technological realization of the DSMCLE proposed in the present invention is based on known basic technological processes that are by now well developed and widely used. The proposal meets the criterion "industrial applicability". The main distinction in its manufacturing consists in the features of the heterostructure and the integral connections of the master laser with the linear amplifier and the linear amplifiers with the perpendicular amplifiers.

Another aspect of the present invention is a diode source of multibeam coherent laser emission with vertical emission (hereinafter referred to as the DSMCLE-VE) containing at least one, at least single-mode, single-frequency master diode laser hereinafter referred to as the master laser, at least one diode optical amplifier hereinafter referred to as the linear amplifier integrally and optically connected with said master laser, at least two diode optical amplifiers hereinafter referred to as the perpendicular amplifiers integrally and optically connected with the linear amplifier. Said master laser and said linear amplifier and said perpendicular amplifiers are formed in a common heterostructure based on semiconductor compounds. Said heterostructure contains at least one active layer, at least two cladding layers, and an emission leak-in region transparent for emission. Said leak-in region is placed between the active layer and a corresponding cladding layer at least on one side of the active layer, said leak-in region contains at least a leak-in layer. Said heterostructure is characterized by the ratio of the effective refractive index $n_{eff}$ of the heterostructure to the refractive index $n_{IN}$ of the leak-in layer, namely, the ratio $n_{eff}$ to $n_{IN}$ is in the range from one to one minus gamma, where gamma is determined by a number much less than one. Said master laser includes an active stripe lasing region with connected metallization layers, an emission confinement region with a connected insulating layer, said confinement region is located on each lateral side of the active lasing region of the master laser, as well as ohmic contacts, optical facets, reflectors, an optical resonator. On both optical facets the reflectors of the optical resonator have reflection coefficients near one, and they are located in the specified vicinity of location of the active layer of the heterostructure. Each linear amplifier including at least an active amplification region with connected metallization layers is located so that the optical axis of propagation of emission of the master laser coincides with the optical axis of the linear amplifier. Each perpendicular amplifier including at least an active amplification region with connected metallization layers and an optical output facet with an optical antireflection coating is located so that the optical axis of the perpendicular amplifier is located at a right angle (modulus) to the optical axis of the linear amplifier. In the vicinity of intersection of the optical axis of the linear amplifier with the optical axis of each perpendicular amplifier there is an integral element for flow of a specified portion of laser emission from the linear amplifier to the perpendicular amplifier that is arbitrarily called a rotary element. Said rotary element consists of at least one optical reflecting plane perpendicular to the plane of the heterostructure layers, crossing the active layer and part of the heterostructure leak-in region within the thickness of the leak-in layer from 20% to 80%, and making angles of inclination with the optical axes of the linear amplifier and of the perpendicular amplifier about 45° (modulus). Besides, the possibility of emission output in the direction perpendicular to the heterostructure plane is achieved through the fact that along the active region at least of one perpendicular amplifier in the direction of the optical axis of propagation of twice amplified laser emission at a certain distance from the rotary element there is at least one output element, additionally introduced, including at least one optical reflecting plane crossing the planes of a number of heterostructure layers at an angle of inclination of 45° (modulus) including the active layer and partially the leak-in layer, namely, from 30% to 80% of its thickness.

The essential distinction of the proposed new DSMCLE-VE made on the basis of an original heterostructure consists in an efficient two-stage integrated combination of a master diode laser (hereinafter referred to as the master laser) connected with an integrated linear diode optical amplifier (hereinafter referred to as the linear amplifier), said linear amplifier being in turn connected with integrated perpendicular diode optical amplifiers (hereinafter referred to as the perpendicular amplifiers). The novelty of the proposed DSMCLE-VE is that the integral connection of the master laser with said amplifiers is carried out without focusing optics. At the first stage the integral connection of the master laser and the linear amplifier is realized, in this case the directions of the optical axes of propagation of emissions of said master laser and linear amplifier coincide. At the second stage of integral connection of the linear amplifier and the perpendicular amplifier the directions of propagation of the optical axes of emissions of said amplifiers are mutually perpendicular. The flow of laser emission from the linear amplifier to the perpendicular amplifiers is carried out with the use of original rotary elements placed at places of connection of the active regions of the perpendicular amplifiers to the lateral sides of the active regions of the linear amplifiers. Besides, the novelty and originality of the proposal consist in the fact that additional original output elements are introduced into the active regions of the perpendicular amplifiers in the direction of their optical axes. Said elements include an optical reflecting plane placed across the active region of the perpendicular amplifier and penetrating from the external layer into the emission leak-in layer (to its part) at an angle of inclination of 45° (modulus). In this case the realization of output of amplified laser emission additionally in the "vertical" direction perpendicular to the heterostructure plane becomes possible.

In the preferred embodiment the amplified laser emission is output both in the direction of the external layer of the heterostructure and/or in the direction of the semiconductor substrate.

In the preferred embodiment the optical reflecting plane of the output element that is maximally removed from the rotary element is made penetrating deep into the heterostructure to the cladding layer on the side of the substrate.

In the preferred embodiment on the optical facets the reflectors of the optical resonator of the master laser are placed from the heterostructure surface to a specified depth in the leak-in region. In this case the integral connection of the master laser (without focusing optics and practically without loss) with each of two linear amplifiers is carried out mainly through the deep-lying part of the leak-in layer of the heterostructure, bypassing the nontransmitting reflectors of the optical resonator of the master laser.

In the preferred embodiment the linear amplifier can be located on one end side of the optical resonator of the master laser, and on each end side of the optical resonator there can be one linear amplifier.

In the preferred embodiment the master laser provides lasing at one fundamental mode and, if necessary, provides single-frequency lasing. To achieve stable single-frequency lasing (as well as single-frequency tuning), said reflectors of the optical resonator of the master laser are made as distributed Bragg reflectors.

In the preferred embodiment in the lateral confinement region of the master laser there are at least one dividing-confinement subregion and at least one confinement subregion, and the dividing-confinement subregion of a specified width is on both lateral sides of the active lasing region of the master laser from the heterostructure surface to a specified depth, not reaching the depth of location of the active layer, the confinement subregion is on both lateral sides of said dividing-confinement subregion from the heterostructure surface to a specified depth exceeding the depth of location of the active layer. The unusual lying of the confinement subregion (with crossing the active layer) provides the mode stability of laser emission at increased laser output powers.

In the preferred embodiment the active region of the linear amplifier can be made as a fully stripe region, or fully widening, or widening with a smooth transition to the stripe part. In the last version the widening part of the active region of the linear amplifier is adjacent to the master laser, and the smooth transition of said widening part to the stripe active region is realized till the nearest location of the rotary element.

In the preferred embodiment to each lateral side of the active region of the linear amplifier a dividing-confinement subregion of a specified width is adjacent that is placed from the heterostructure surface to a specified depth, not reaching the depth of location of the active layer. When necessary, to each lateral side of the dividing-confinement subregion a confinement subregion is connected that is placed from the heterostructure surface to a specified depth exceeding the depth of location of the active layer.

In the preferred embodiment the optical reflective coating on the free optical facet of the linear amplifier has a reflection coefficient near one.

In the preferred embodiment the active region of the perpendicular amplifier can be made as a fully stripe region, or fully widening, or widening with a smooth transition to the stripe part. In the last embodiment the widening part of the active region of the perpendicular amplifier is adjacent to the linear amplifier, and the smooth transition of said widening part to the stripe active region is realized at a specified distance from the rotary element.

In the preferred embodiment to each lateral side of the active region of the perpendicular amplifier a dividing-confinement subregion of a specified width is adjacent that is placed from the heterostructure surface to a specified depth, not reaching the depth of location of the active layer. When necessary, to each lateral side of the dividing-confinement subregion a confinement subregion is connected that is placed from the heterostructure surface to a depth exceeding the depth of location of the active layer.

In the preferred embodiment the optical reflecting plane of at least one rotary element maximally removed from the reflector of the optical resonator of the master laser is made penetrating into the heterostructure, at least to the cladding layer on the side of the substrate.

In the preferred embodiment the optical antireflection coating at least on the optical facets of output of amplified emission of the perpendicular amplifier, has a reflection coefficient near zero.

In the preferred embodiment the optical reflecting plane of the rotary element has an angle of inclination of plus 45°, the optical reflecting plane of the rotary element next to said optical reflecting plane has a angle of inclination of minus 45°. This has allowed the realization of emission output in opposite directions.

In the preferred embodiment the common heterostructure contains at least two active layers electrically connected to one another by thin heavily doped layers of the p-type and the n-type with a tunnel transition between them.

In the preferred embodiment not only an asymmetric heterostructure may be used, but also a symmetric heterostructure, in which the thickness of the leak-in layer in the leak-in region on the side of the substrate is equal to the thickness of the leak-in layer in the leak-in region on the side of the external layer of the heterostructure.

In the preferred embodiment the master laser, the linear amplifiers, and the perpendicular amplifiers have independent ohmic contacts.

The essence of the unobvious DSMCLE-VE proposed in the present invention consists in the proposed common heterostructure for a single-mode and single-frequency master laser, linear and perpendicular amplifiers with unusually large sizes of the near emission field in the plane perpendicular to the active layer of the heterostructure and unusually low divergence of output emission. The essence of the present invention consists also in the original and efficient two-stage process of integral connections: at the first stage the connection of a single-frequency, single-mode master laser with a linear amplifier, at the second stage the connection of linear amplifiers with perpendicular amplifiers. In this case the active regions of the perpendicular amplifiers are placed at a right angle to the active amplification regions of the linear amplifiers. The flow of a specified portion of laser emission from the linear amplifiers to the perpendicular amplifiers is realized by introduced original rotary elements placed at places of intersection of the active regions of the linear amplifiers with the perpendicular amplifiers. Besides, by introducing original integral output elements placed along the optical axis of the perpendicular amplifiers, the original and efficient output of multibeam high-quality amplified laser emission of superhigh power is realized, said emission being directed vertically with respect to the planes of the heterostructure layers (both in the direction of the external layer of the heterostructure and in the direction of the semiconductor substrate).

The technological realization of the DSMCLE-VE proposed in the present invention is based on known basic technological processes that are by now well developed and widely used. The proposal meets the criterion "industrial applicability". The main distinction in its manufacturing consists in the features of the heterostructure, the integral connections of the master laser with the linear amplifier and the linear amplifiers with the perpendicular amplifiers, as well as integral output elements in semiconductor amplifiers.

BRIEF DESCRIPTION OF THE DRAWINGS

The present invention will be described in detail below in connection with FIGS. 1 ... 8, where.

DETAILED DESCRIPTION OF PREFERRED EMBODIMENTS

Figure 1:
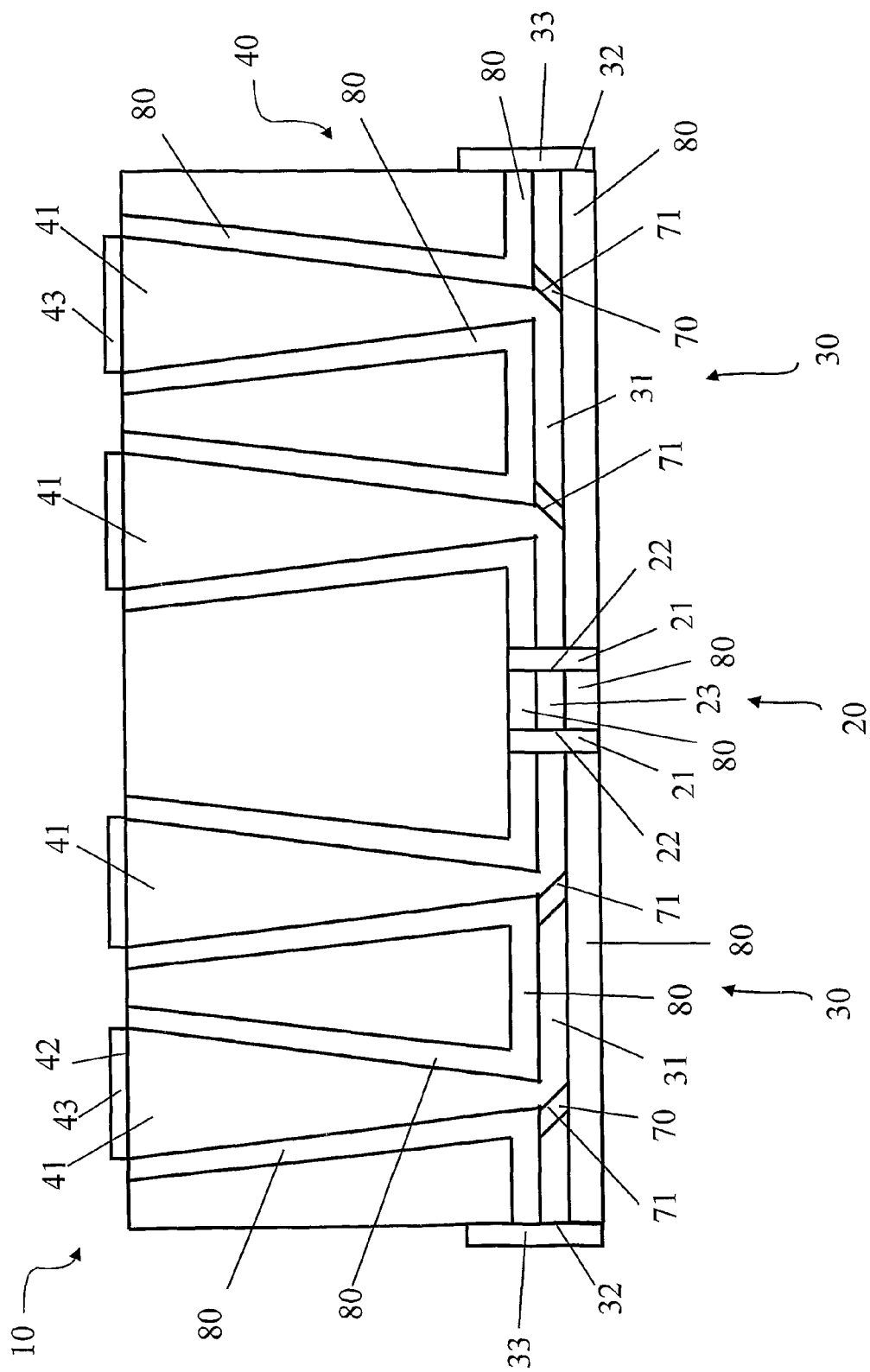
FIG. 1 is a schematic illustration of the top view of the proposed DSMCLE with the master laser, two linear amplifiers with antireflection coatings on the external optical facets, and four perpendicular amplifiers.

Hereinafter the invention is explained by the description of concrete embodiments with references to the enclosed drawings. The given examples of the embodiments of the diode source of multibeam coherent laser emission (DSMCLE) and a diode source of multibeam coherent laser emission with vertical emission output (DSMCLE-VE) are not the only ones and assume the availability of other realizations (including the known wavelength ranges), the features of which are reflected in the sum of the distinctions according to the claim.

In the DSMCLE designs proposed for consideration and represented in FIGS. 1-8 the following designations are given:

10—Proposed DSMCLE.
20—Master diode laser. Its components:
21—Nontransmitting reflector of optical resonator hereinafter referred to as the nontransmitting optical reflector,
22—Optical facet of optical resonator,
23—Stripe active lasing region.
30—Linear amplifier. Its components:
31—Stripe active amplification region,
32—External optical facet,
33—Antireflection coating,
34—Widening active amplification region with smooth transition to stripe region.
40—Perpendicular amplifier. Its components:
41—Widening active amplification region,
42—Output optical facet,
43—Antireflection coating,
44—Stripe active amplification region.
50—Heterostructure. Its components:
51—Active layer,
52—Cladding layer on the side of substrate,
53—Adjusting layer on the side of substrate,
55—Cladding layer on the side of external layer,
56—Leak-in region on the side of external layer,
57—External contact layer of p-type,
60—Substrate for heterostructure,
61—External surface of substrate.
70—Rotary element. Its components:
71—Optical reflecting plane,
72—Optical reflecting plane penetrating to cladding layer 52.
80—Lateral confinement regions for master laser, linear and perpendicular amplifiers.
100—DSMCLE-VE embodiment.
110—Output element,
111—Optical reflecting plane,
112—Optical reflecting plane penetrating to cladding layer 52,
113—Antireflection coating for output emission.

The proposed DSMCLE 10 (see FIGS. 1-2) contains the single-mode master laser 20 lasing at a fundamental mode and integrally connected with two linear amplifiers 30 connected to the master laser 20 on both end sides. At the ends of the laser optical resonator the nontransmitting optical reflectors 21 are placed. The linear amplifiers 30 that have on the external optical facet 32 the antireflection coating 33 are in turn integrally connected with the use of the rotary elements 70 with the perpendicular amplifiers 40 with the widening active amplification regions 41. The output of amplified laser emission is carried out through the antireflection optical facets 42 of each of four perpendicular amplifiers 40.

The DSMCLE 10 is made on the basis of the common laser heterostructure 50 both for the master laser 20 and for said diode amplifiers 30 and 40. The heterostructure 50 is grown on the substrate 60 of the n-type GaAs. The integral connection of the linear amplifiers 30 with the perpendicular amplifiers 40 is realized with the use of the rotary elements 70. The heterostructure 50 is grown on the basis of AlGaAs semiconductor compounds with one active layer 51 of InAlGaAs. The laser wavelength determined by the composition and thickness of the active layer 51 is chosen equal to 0.976 μm.

Between the active layer 51 and the cladding layer 52 on the side of the substrate 60 the first leak-in region (including the adjusting layer 53 and the leak-in layer 54) is located. On the opposite side between the active layer 51 and the cladding layer 55 the second leak-in region 56 (including the adjusting layer and the leak-in layer) is located, to which the semiconductor contact layer 57 of the p-type is adjacent. The metallization layers and corresponding insulating dielectric layers are not shown in the figures. In fact, the set of all layers of the heterostructure 50 that are located between the cladding layers 52 and 55 forms an extended waveguide region. The leak-in layers are made of AlGaAs. The thickness of the leak-in layer 54 on the side of the substrate 60 is chosen equal to 6 µm, which is an order of magnitude more than the thickness of the leak-in layer on the opposite side. The values of the calculated ratios of the effective refractive index $n_{eff}$ of the heterostructure 50 to the refractive index $n_{IN}$ of the leak-in layer 54 ($n_{eff}/n_{IN}$) at current densities of 0.3 kA/cm$^2$ and 5.0 kA/cm$^2$ were respectively equal to 0.999868 and 0.999772.

Based on the above-described heterostructure 50, integrally connected one master laser 20, two linear amplifiers 30, and four perpendicular amplifiers 40 are formed. On both sides on the optical facets 22 of the optical resonator of the diode laser 20 the reflectors 21 are formed (by deposition of coatings) with reflection coefficients near one (the nontransmitting optical reflectors). The integral connection of the master laser 20 with the linear amplifiers 30 is realized mainly through the deep-lying leak-in layer 54, bypassing the nontransmitting reflector 21 of the optical resonator. The active lasing region 23 of the master laser 20 is made as a stripe region with a stripe width of 9 µm, the length of the optical resonator is chosen equal to 1000 µm. The width and length of the stripe active amplification region 31 in each of two linear amplifiers 30 are respectively 12 µm and 2000 µm. On the external optical facet 32 of each linear amplifier 30 the antireflection coating 33 with a reflection coefficient near zero (less than 0.0001) is deposited.

The integral optical connection between each linear amplifier 30 and two perpendicular amplifiers 40 is realized by placement of two rotary elements 70 in the active amplification region 31. Each rotary element 70 made by etching includes the optical reflecting plane 71 located at a right angle to the plane of the layers of the heterostructure 50 and penetrating vertically inside from the contact layer 57 to the leak-in layer 54 to 60% of its thickness. In this case said reflecting plane 71 of the rotary element 70 is turned at an angle of 45° (modulus) with respect to the optical axes of propagation of amplified emission both in the linear amplifier 30 and in two perpendicular amplifiers 40. The active amplification region 41 of each perpendicular amplifier 40 is made widening with a widening angle of 6°. At a length of the perpendicular amplifier of 5000 µm the width of the optical facet 42 outputting amplified emission is 250 µm. On the output optical facet 42 of each linear amplifier 40 the antireflection coating 43 with a reflection coefficient near zero (less than 0.0001) is deposited.

The lateral confinement regions 80 with the same main characteristics are made adjacent on both lateral sides to the stripe active lasing region 23 of the master laser 20 as well as to each stripe active region 31 of two linear amplifiers 30 and to each widening active region 41 of four perpendicular amplifiers 40. Said regions 80 contain two subregions (not shown in the figures). The first stripe dividing-confinement subregion contiguous with said regions 23, 31, and 41 is formed by etching as a groove of width 2.0 µm to a depth of 0.7 µm not reaching the depth of lying of the active layer 51 of the heterostructure 50. The second confinement subregion contiguous with said first subregion is formed by etching as a recessed groove crossing the plane of lying of the active layer 51 and penetrating into the leak-in layer 54 to 60% of its thickness. Both grooves are filled with a dielectric.

Figure 2:
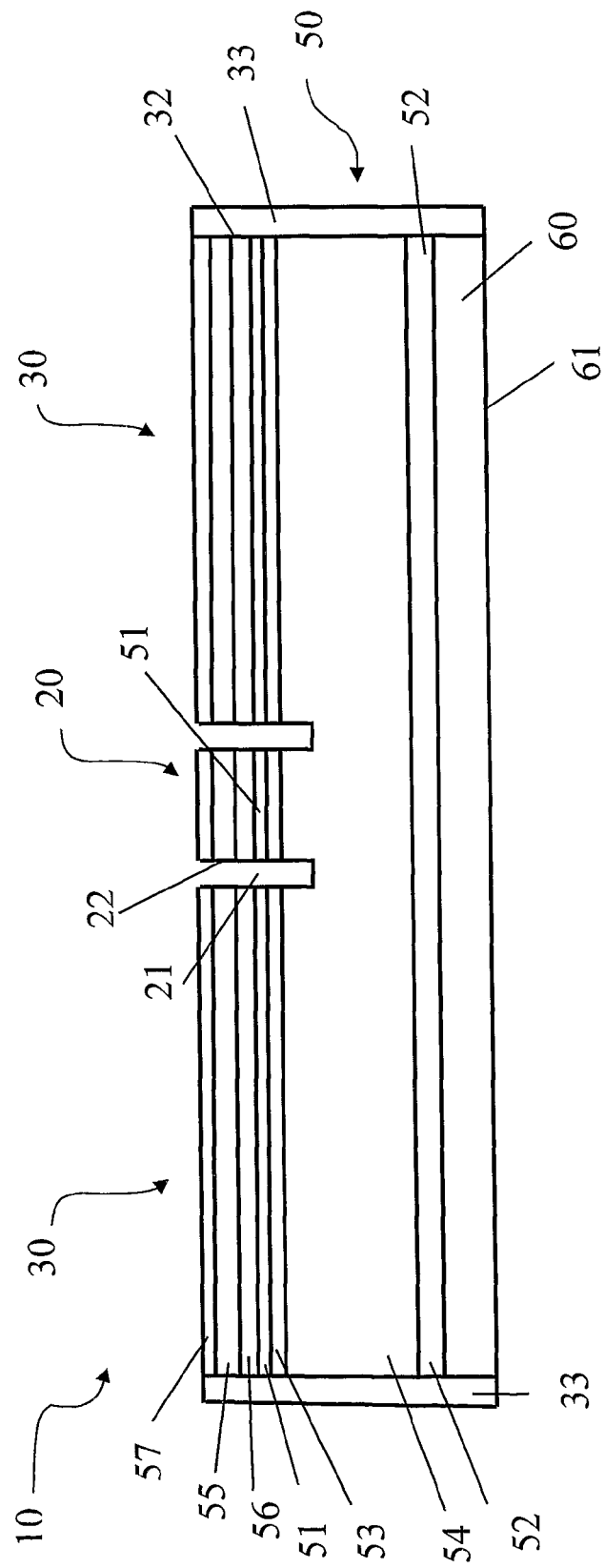
FIG. 2 is a schematic illustration of the longitudinal section of the proposed DSMCLE along the optical axes of the master laser and of the linear amplifiers integrally connected with the master laser.

The following embodiment of the DSMCLE 10 (not shown in the figures) differed from the embodiment represented in FIGS. 1-2 in that in this embodiment the nontransmitting reflectors 21 of the optical resonator are formed as distributed Bragg reflectors providing the stable single-frequency lasing of the master laser.

The following embodiment of the DSMCLE 10 (not shown in the figures) differed from the embodiment represented in FIGS. 1-2 in that in this embodiment the common heterostructure 50 contains at least two active layers electrically connected to one another by thin heavily doped layers of the p-type and the n-type with a tunnel transition between them.

The following embodiment of the DSMCLE 10 (not shown in the figures) differed from the embodiment represented in FIGS. 1-2 in that this embodiment contains fifty perpendicular amplifiers 40 and fifty rotary elements 70 at a length of each linear amplifier 30 of 20,000 µm.

The following embodiment of the DSMCLE 10 (see FIG. 3) differed from the embodiment represented in FIGS. 1-2 in that in this embodiment each (of two) active amplification region 34 nearest to the master laser is made widening in its initial part with a smooth transition to the stripe part 31 with a stripe width of 50 µm. Each active amplification region 44 of the perpendicular amplifiers 40 is made as the stripe region. Besides, in each rotary element 70 most removed from the optical facet 22 of the master laser 20 the optical reflecting plane 72 penetrates into the leak-in layer 54 to 100% of its thickness. In this case there is no more necessity of manufacturing the antireflection coatings 33 for the linear amplifiers 30. Let us note that in FIG. 3 and FIGS. 4-6 the lateral confinement regions are not shown.

The following embodiment of the DSMCLE 10 (not shown in the figures) differed from the previous one in that in this embodiment the lateral confinement regions 80 adjacent to the widening active amplification regions 34 of the linear amplifier 30 consist only of a dividing-confinement subregion.

The following embodiment of the DSMCLE 10 (not shown in the figures) differed from the previous one in that in this embodiment the lateral confinement regions 80 adjacent to the widening active amplification regions 41 of the perpendicular amplifier 40 consist only of a dividing-confinement subregion.

Figure 3:
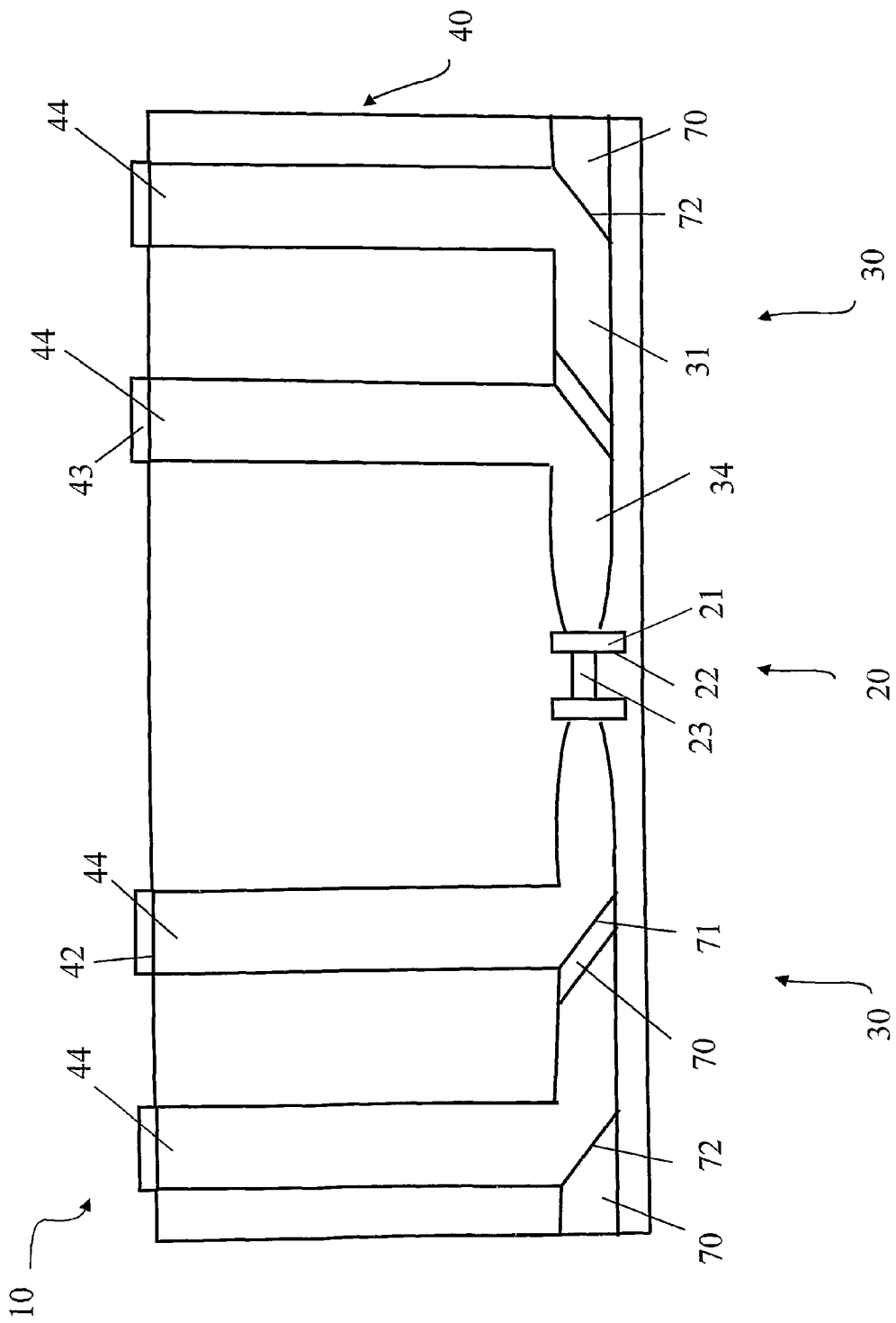
FIG. 3 is a schematic illustration of the top view of the proposed DSMCLE differing from the DSMCLE schematically represented in FIG. 1 in that the active amplification region of each of two linear amplifiers consists of a widening part smoothly going into a stripe part, besides, there are no antireflection coatings on the external optical facets of the linear amplifier.
Figure 4:
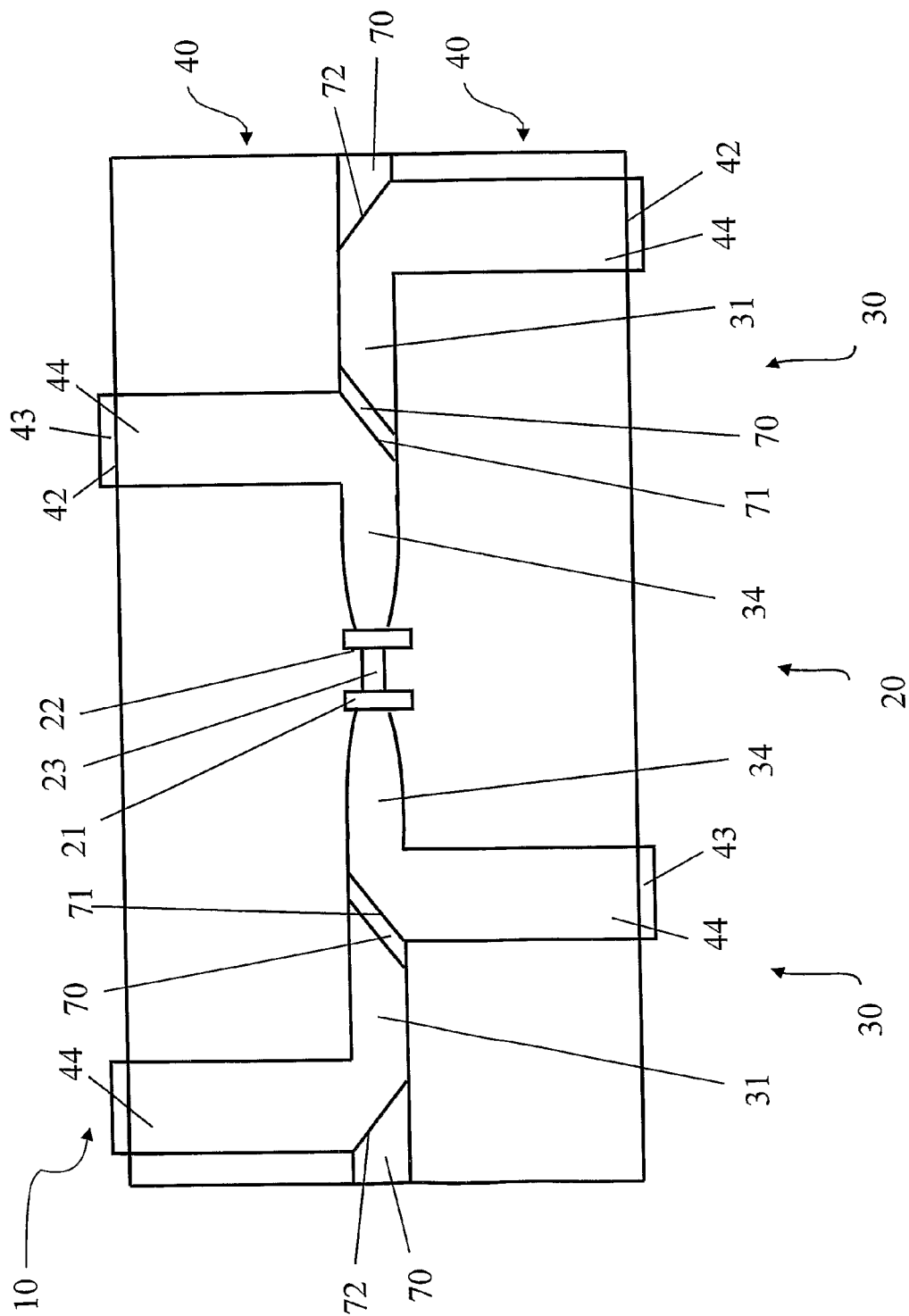
FIG. 4 is a schematic illustration of the top view of the proposed DSMCLE differing from the DSMCLE schematically represented in FIG. 3 in that to the active amplification regions of two linear amplifiers through corresponding rotary elements four perpendicular amplifiers are connected, amplified laser emission of which is alternately propagated in opposite directions.
Figure 5:
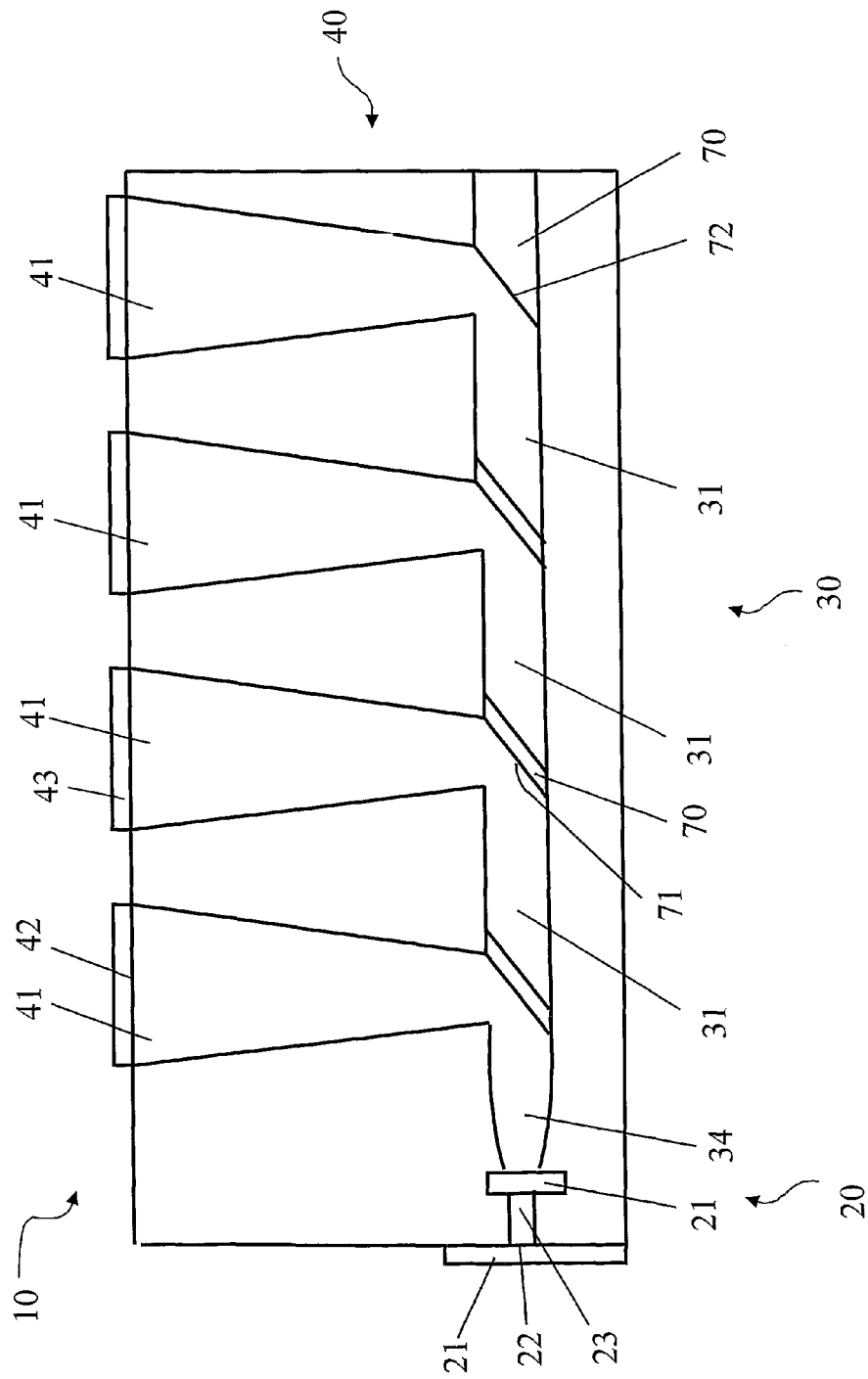
FIG. 5 is a schematic illustration of the top view of the proposed DSMCLE differing from the DSMCLE schematically represented in FIG. 3 in that one linear amplifier is integrally connected to the master diode laser on one side of the nontransmitting reflector of the optical resonator.
Figure 6:
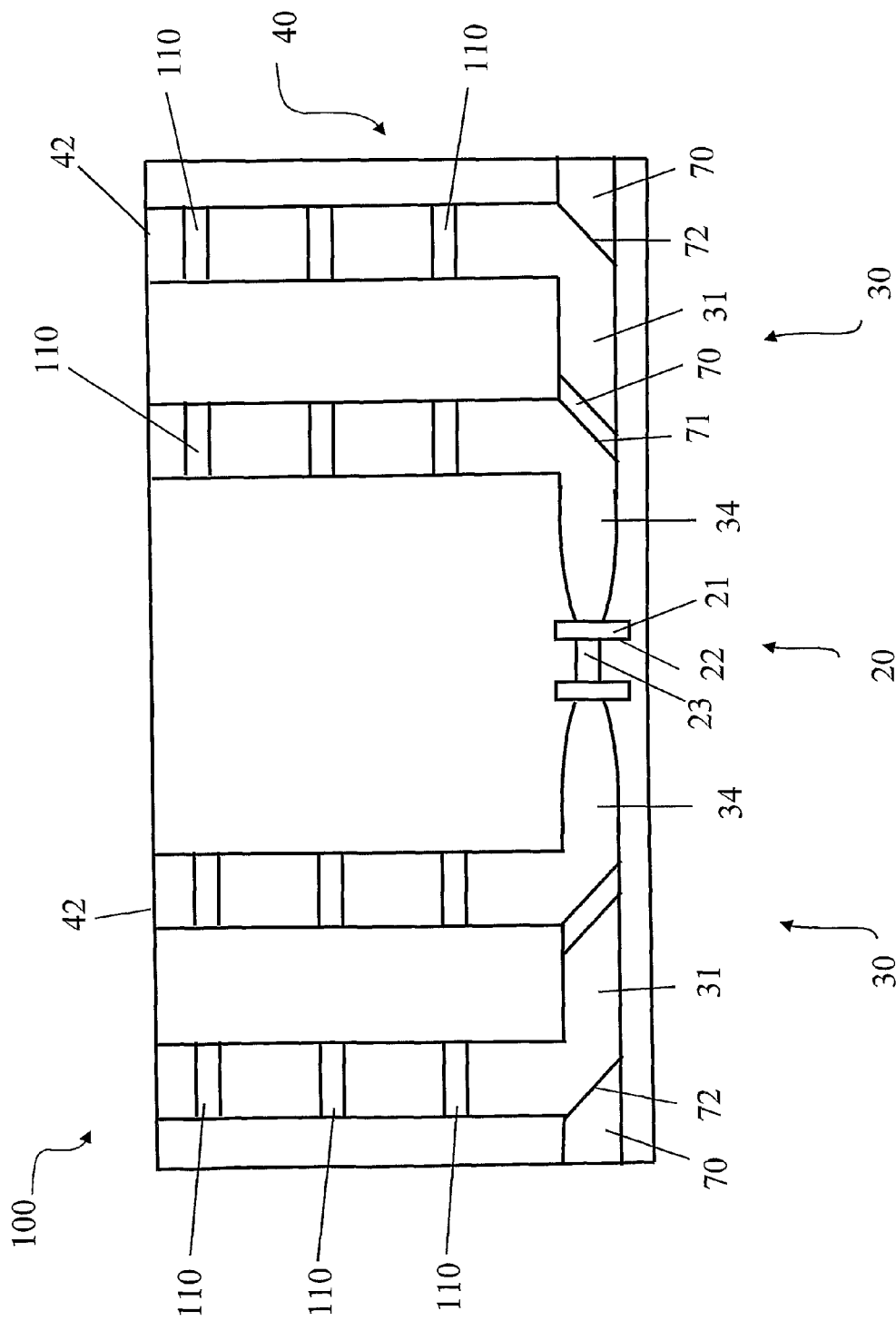
FIG. 6 is a schematic illustration of the top view of the proposed DSMCLE-VE differing from the DSMCLE schematically represented in FIG. 3 in that in each of four perpendicular amplifiers along the longitudinal optical axis three output elements for amplified laser emission are formed.
Figure 7:
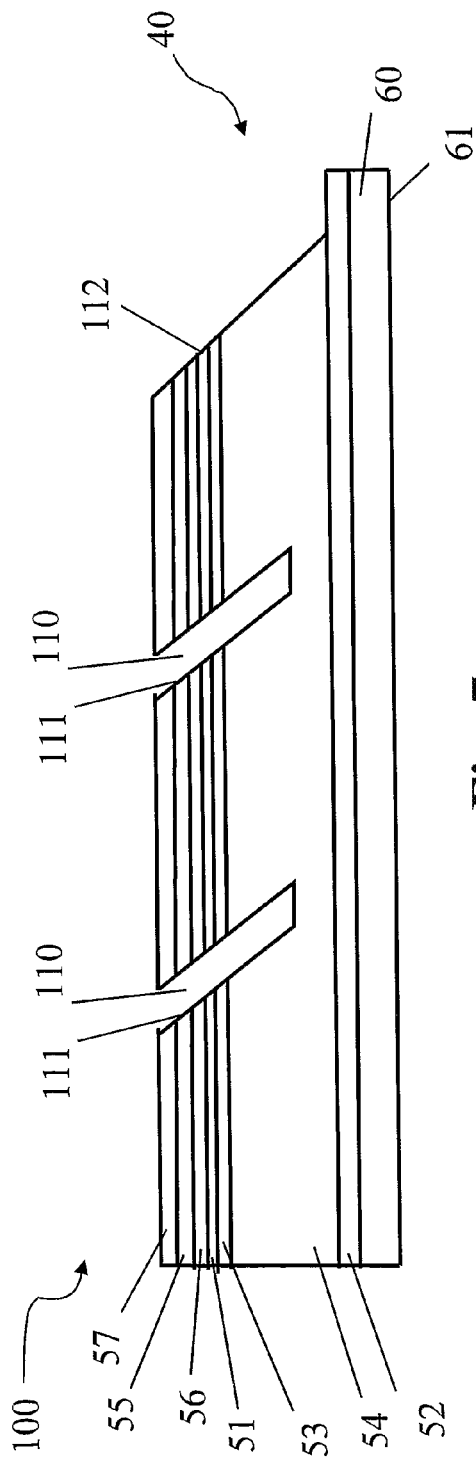
FIG. 7 is a schematic illustration of the longitudinal section of one of four perpendicular amplifiers of the proposed DSMCLE-VE, in which the output elements realize the output of beams of amplified laser emission through the substrate.
Figure 8:
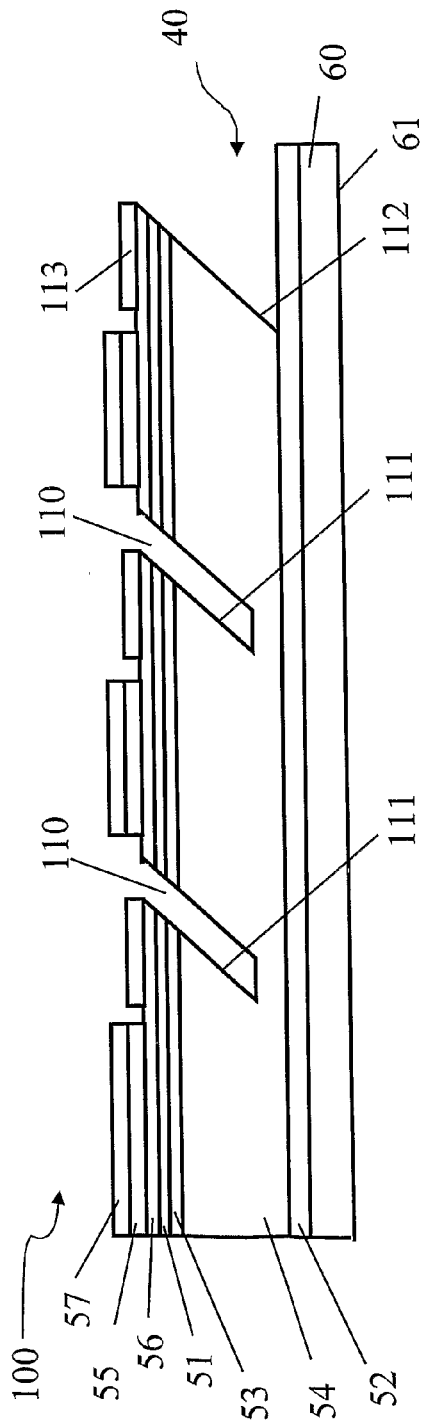
FIG. 8 is a schematic illustration of the longitudinal section of the perpendicular amplifier schematically represented in FIG. 7 differing in that the output elements realize the output of beams of amplified laser emission in the direction of the external surface of the heterostructure.

The following embodiment of the DSMCLE 10 (see FIG. 4) differed from the embodiment represented in FIG. 3 in that in this embodiment in the active amplification region 31 of each linear amplifier 30 the optical reflecting plane 72 is turned with respect to the optical reflecting plane 71 of the rotary element 70 at a right angle) (90°). In this case in the perpendicular amplifiers 40 connected to the linear amplifiers 30 with said optical reflecting planes 71 and 72 of the rotary elements 70 output amplified laser emission is propagated in opposite directions.

The following embodiment of the DSMCLE 10 (see FIG. 5) differed from the embodiment represented in FIG. 3 in that in this embodiment the integral connection of the linear amplifier 30 with the master laser 20 is carried out on one side through the nontransmitting reflector 21 of the optical resonator. On the opposite side of the optical resonator the nontransmitting reflector 21 is formed on the cleaved optical facet 22. The active amplification regions 41 of four perpendicular amplifiers 40 are joined to one active amplification region 34 and three stripe active amplification regions 31 of the linear amplifier 30 through four rotary elements 70.

The following embodiment of the DSMCLE 10 differed from the previous one in that in this embodiment to the master laser 20, to the linear amplifiers 30, and to the perpendicular amplifiers 40 independent (separate) ohmic contacts are formed that are realized by introduction of thin dividing stripes between the ohmic metallization layers (not shown in the figures).

The proposed DSMCLE-VE 100 represented in the following figures differs from the above DSMCLE embodiments in that in the perpendicular amplifiers 40 along the active amplification regions 41 two and more integral output elements 110 are additionally formed by etching. Said elements 110 are formed at specific distances from the rotary element 70 and between themselves. Said elements 110 are designed to output amplified laser emission in the vertical direction with respect to the plane of the layers of the heterostructure.

The following embodiment of the DSMCLE-VE 100 (see FIGS. 6-7) differs from the previous one in that in this embodiment each integral output element 110 formed by etching includes the optical reflecting plane 111 for amplified laser emission placed across the stripe active amplification region 44. Said plane 111 penetrates with crossing the planes of the layers of the heterostructure 50 (including the active layer 51) at an angle of inclination of minus 45° into the leak-in layer 54 to 65% of its thickness. For the output element 110 most removed from the rotary element 70 the optical reflecting plane 112 penetrates into the leak-in layer 54 to 100% of its thickness. At places of output of amplified laser emission on the external side 61 of the substrate 60 the antireflection coating 113 with a reflection coefficient less than 0.0001 is formed. The metallization layers and the antireflection coating 113 on the remaining free surface of the substrate 60 are not shown in FIG. 7.

The following embodiment of the DSMCLE-VE 100 (see FIG. 6 and FIG. 8) differs from the previous one in that in this embodiment the angle of inclination of the optical reflecting planes 111 of the integral output elements 110 is plus 45°. In this embodiment the output of amplified laser emission is realized at a right angle to the planes of the layers of the heterostructure 50 in the direction opposite to the location of the substrate 60. In this case at places of output of amplified laser emission after removal of the heavily doped contact layer 57 and cladding layer 55 the antireflection coating 113 with a reflection coefficient less than 0.0001 is deposited. The metallization layers on the surface of the contact layer 57 are not shown in FIG. 8.

The proposed diode sources of multibeam coherent laser emission, namely, the DSMCLE and the DSMCLE-VE make it possible to produce unusually high powers of coherent laser emission both in the horizontal plane of propagation of emission in the device and in the plane perpendicular to the active layer of the heterostructure with unusually low divergence of output emission.

INDUSTRIAL APPLICABILITY

Diode sources of multibeam coherent laser emission are used in precision laser material processing (laser cutting, welding, drilling, surface melting, dimensional processing of various parts, laser marking and engraving), in laser devices for surgery and power therapy, in laser rangefinders, laser target designators, for realization of frequency-doubled lasers, and for pumping fiber and solid-state lasers and optical amplifiers.

The invention claimed is:
1. A diode source of multibeam coherent laser emission containing
at least one master laser, the master laser being a single-mode single-frequency master diode laser,
at least one linear amplifier, the linear amplifier being a diode optical amplifier integrally and optically connected with said master laser,
at least two perpendicular amplifiers, the perpendicular amplifiers being diode optical amplifiers integrally and optically connected with the linear amplifier;
said master laser, said linear amplifier and said perpendicular amplifiers being formed in a common heterostructure based on semiconductor compounds, said heterostructure containing
at least one active layer,
at least two cladding layers, and
an emission leak-in region transparent for emission, said leak-in region being placed between the active layer and a corresponding cladding layer at least on one side of the active layer and containing at least a leak-in layer, wherein said heterostructure is characterized by the ratio of the effective refractive index $n_{\it eff}$ of the heterostructure to the refractive index $n_{IN}$ of the leak-in layer, namely, the ratio of $n_{\it eff}$ to $n_{IN}$ being in the range from one to one minus gamma, where gamma is determined by a number much less than one;
said master laser including
an active stripe lasing region with connected metallization layers,
a lateral emission confinement region with a connected insulating layer, said confinement region being located on each lateral side of the active stripe lasing region of the master laser,
ohmic contacts,
optical facets,
reflectors, and
an optical resonator, and wherein on both optical facets the reflectors of the optical resonator have reflection coefficients near one and are placed in the specified vicinity of location of the active layer of the heterostructure;
the linear amplifier including at least an active amplification region with connected metallization layers located such that an optical axis of propagation of emission of the master laser coincides with an optical axis of the linear amplifier;
the perpendicular amplifier including at least an active amplification region with connected metallization layers and an optical output facet with an optical antireflection coating being located such that the optical axis of the perpendicular amplifier is located at a right angle (modulus) to the optical axis of the linear amplifier;
and wherein in a vicinity of an intersection of the optical axis of the linear amplifier with the optical axis of each perpendicular amplifier there is a rotary element for flow of a specified portion of laser emission from the linear amplifier to the perpendicular amplifier, said rotary element including at least one optical reflecting plane perpendicular to the plane of the layers of the heterostructure, crossing the active layer and part of the leak-in region within a thickness of the leak-in layer from 20% to 80%, and making angles of inclination with the optical axes of the linear amplifier and of the perpendicular amplifier of about 45° (modulus).
2. The diode source of multibeam coherent laser emission as defined in claim 1 wherein the reflectors of the optical resonator of the master laser are located on each optical facet from a surface of the heterostructure to a specified depth in the leak-in region.

3. The diode source of multibeam coherent laser emission as defined in claim 1 wherein on each side of the optical resonator of the master laser there is one linear amplifier.

4. The diode source of multibeam coherent laser emission as defined in claim 1 wherein the reflectors of the optical resonator of the master laser are distributed Bragg reflectors.

5. The diode source of multibeam coherent laser emission as defined in claim 1 wherein in the lateral confinement region of the master laser there is at least one dividing-confinement subregion and at least one confinement subregion, the dividing-confinement subregion of a specified width is located on both lateral sides of the active lasing region of the master laser from a surface of the heterostructure to a specified depth, not reaching the depth of location of the active layer, the confinement subregion is located on both lateral sides of said dividing-confinement subregion from the surface of the heterostructure to a specified depth exceeding the depth of location of the active layer.

6. The diode source of multibeam coherent laser emission as defined in claim 1 wherein the active amplification region of the linear amplifier is widening at least at part of its length on the side of the master laser.

7. The diode source of multibeam coherent laser emission as defined in claim 6 wherein there is a smooth transition of said widening part to the stripe part.

8. The diode source of multibeam coherent laser emission as defined in claim 1 wherein each lateral side of the active amplification region of the linear amplifier has a dividing-confinement subregion of a specified width placed from a surface of the heterostructure to a specified depth, not reaching the depth of location of the active layer.

9. The diode source of multibeam coherent laser emission as defined in claim 8 wherein each lateral side of the dividing-confinement subregion has a confinement subregion placed from the surface of the heterostructure to a depth exceeding the depth of location of the active layer.

10. The diode source of multibeam coherent laser emission as defined in claim 1 wherein the active amplification region of the perpendicular amplifier is widening at least at certain part of its length on the side of the linear amplifier.

11. The diode source of multibeam coherent laser emission as defined in claim 10 wherein there is a smooth transition of said widening part to the stripe part.

12. The diode source of multibeam coherent laser emission as defined in claim 1 wherein each lateral side of the active amplification region of the perpendicular amplifier has a dividing-confinement subregion of a specified width placed from a surface of the heterostructure to a specified depth, not reaching the depth of location of the active layer.

13. The diode source of multibeam coherent laser emission as defined in claim 12 wherein each lateral side of the dividing-confinement subregion has a confinement subregion placed from the surface of the heterostructure to a specified depth exceeding the depth of location of the active layer.

14. The diode source of multibeam coherent laser emission as defined in claim 1 wherein the optical reflecting plane of a rotary element maximally removed from the reflector of the optical resonator of the master laser is located from a surface of the heterostructure to the cladding layer on the side of the substrate.

15. The diode source of multibeam coherent laser emission as defined in claim 1 wherein the optical antireflection coating on the optical facets of output of amplified emission of the perpendicular amplifier has a reflection coefficient near zero.

16. The diode source of multibeam coherent laser emission as defined in claim 1 wherein the optical reflecting plane of the rotary element has an angle of inclination of plus 45°, the optical reflecting plane of the rotary element next to said optical reflecting plane has an angle of inclination of minus 45°.

17. The diode source of multibeam coherent laser emission as defined in claim 1 wherein in the common heterostructure there are at least two active layers electrically connected to one another by thin heavily doped layers of the p-type and the n-type with a tunnel transition between them.

18. The diode source of multibeam coherent laser emission as defined in claim 1 wherein at least each master laser, each linear amplifier, and each perpendicular amplifier have independent ohmic contacts.

19. The diode source of multibeam coherent laser emission as defined in claim 1 wherein along the active amplification region of at least one of the perpendicular amplifiers in the direction of an optical axis of propagation of a twice amplified laser emission at a certain distance from the rotary element there is at least one introduced output element including at least one optical reflecting plane crossing the planes of a number of heterostructure layers at an angle of inclination of 45° (modulus) including the active layer and partially the leak-in layer, namely, from 30% to 80% of its thickness.

20. The diode source of multibeam coherent laser emission as defined in claim 19 wherein the optical reflecting plane of an output element maximally removed from the rotary element is from a surface of the heterostructure to the cladding layer on the side of the substrate.

* * * * *